(12) United States Patent
Jeong et al.

(10) Patent No.: US 10,564,549 B2
(45) Date of Patent: Feb. 18, 2020

(54) PHOTORESIST STRIPPING APPARATUS, AND METHODS OF STRIPPING PHOTORESIST AND FORMING THIN FILM PATTERN USING THE SAME

(71) Applicant: SAMSUNG DISPLAY CO., LTD., Yongin-si, Gyeonggi-do (KR)

(72) Inventors: Beung Hwa Jeong, Yongin-si (KR); Jong Hyun Choung, Yongin-si (KR); Sung Chul Kim, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 61 days.

(21) Appl. No.: 15/692,437

(22) Filed: Aug. 31, 2017

(65) Prior Publication Data
US 2018/0203360 A1      Jul. 19, 2018

(30) Foreign Application Priority Data
Jan. 16, 2017   (KR) .................. 10-2017-0007112

(51) Int. Cl.
  *G03F 7/42*     (2006.01)
  *H01L 21/027*   (2006.01)
  *H01L 21/3213*  (2006.01)
  *H01L 21/47*    (2006.01)
  *H01L 21/033*   (2006.01)
  *H01L 21/311*   (2006.01)

(52) U.S. Cl.
CPC ................ *G03F 7/42* (2013.01); *G03F 7/427* (2013.01); *H01L 21/0273* (2013.01); *H01L 21/0332* (2013.01); *H01L 21/31133* (2013.01); *H01L 21/32139* (2013.01); *H01L 21/47* (2013.01)

(58) Field of Classification Search
CPC ........................................................ G03F 7/42
See application file for complete search history.

(56) References Cited

U.S. PATENT DOCUMENTS

2004/0099284 A1* 5/2004 Miki ..................... B08B 3/00
                                                                  134/1.3
2005/0051246 A1* 3/2005 Toshima ........... H01L 21/31138
                                                                  148/712

FOREIGN PATENT DOCUMENTS

JP     2006-049712     *  2/2006
KR   1020120075113 A      7/2012

OTHER PUBLICATIONS

Machine translation of JP 2006-049712 available at https://dialog.proquest.conn/professional/patents/docview/1393251385/fulltextwithgraphics/16A57008FE56E9137E0/1?accountid=161361, May 25, 2019. (Year: 2006).*

(Continued)

*Primary Examiner* — Kathleen Duda
(74) *Attorney, Agent, or Firm* — Cantor Colburn LLP

(57) ABSTRACT

A method of forming a thin film pattern includes providing a thin film on a substrate, providing a photoresist on the thin film, forming a first photoresist pattern having a first packing density by exposing and developing the photoresist, etching the thin film by using the first photoresist pattern as a mask, processing the first photoresist pattern to convert the first photoresist pattern into a second photoresist pattern having a second packing density, which is lower than the first packing density, and stripping the second photoresist pattern by spraying steam onto the second photoresist pattern.

14 Claims, 7 Drawing Sheets

(56) References Cited

OTHER PUBLICATIONS

Aleksandra Delplanque et al. UV/Ozone Surface Treatment Increases Hydrophilicity and Enhances Functionality of Su-8 Photoresist Polymer, 2014, p. 280-285, 314, Applied Surface Science, Elsevier.

* cited by examiner

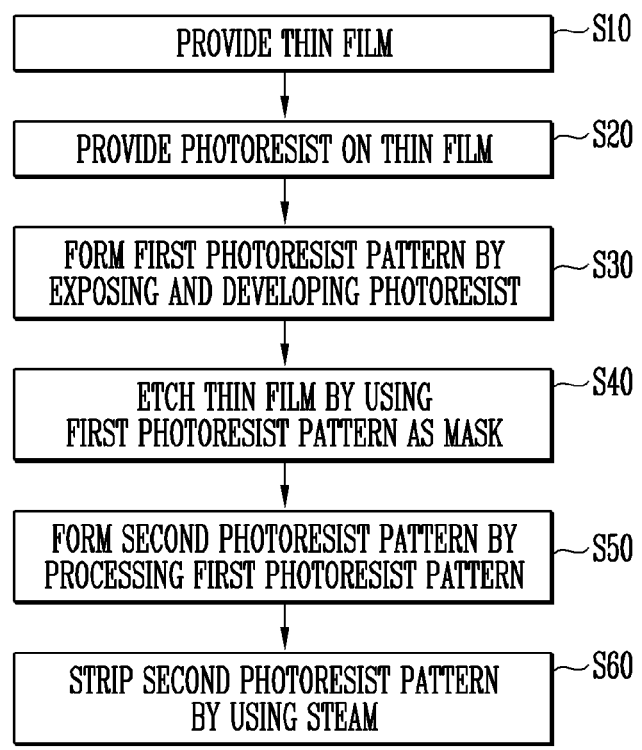

PHOTORESIST STRIPPING APPARATUS, AND METHODS OF STRIPPING PHOTORESIST AND FORMING THIN FILM PATTERN USING THE SAME

This application claims priority to Korean Patent Application No. 10-2017-0007112, filed on Jan. 16, 2017, and all the benefits accruing therefrom under 35 U.S.C. § 119, the content of which in its entirety is herein incorporated by reference.

BACKGROUND

1. Field

Exemplary embodiments of the disclosure relate to a photoresist stripping apparatus, and a method of stripping photoresist and forming thin film pattern using the photoresist stripping apparatus.

2. Description of the Related Art

In general, a process of forming a thin film pattern is used to fabricate an electronic element such as a semiconductor element. A thin film may be formed through a photolithography process. Photolithography is performed in a form of forming a thin film and photoresist on a substrate to be processed, exposing and developing the photoresist, etching the thin film which becomes a target by using the photoresist as a mask, and stripping the photoresist.

SUMMARY

In general, when a thin film is formed through a photolithography process, a large amount of chemical stripping solutions are used to strip photoresist, such that environmental pollution and manufacturing cost may increase.

An exemplary embodiment of the disclosure is to provide a method of forming a thin film pattern to fabricate an electronic element.

Another exemplary embodiment of the disclosure is to provide a method of stripping a photoresist when a thin film pattern is formed.

Still another exemplary embodiment of the disclosure is to provide a photoresist stripping device for stripping a photoresist.

According to an embodiment of the disclosure, a method of forming a thin film pattern includes providing a thin film on a substrate, providing a photoresist on the thin film, forming a first photoresist pattern having a first packing density by exposing and developing the photoresist, etching the thin film by using the first photoresist pattern as a mask, processing the first photoresist pattern to convert the first photoresist pattern into a second photoresist pattern having a second packing density, which is lower than the first packing density, and stripping the second photoresist pattern by spraying steam onto the second photoresist pattern.

According to an embodiment of the disclosure, the processing the first photoresist pattern may include forming microcavities in the first photoresist pattern to be converted into the second photoresist pattern having the second packing density.

According to an embodiment of the disclosure, the stripping the second photoresist pattern by spraying the steam onto the second photoresist pattern may include providing moisture particles of the steam into the microcavities in the second photoresist in a way such that the second photoresist pattern is swollen by the moisture particles, and stripping the second photoresist pattern from the substrate by making a gap therebetween or by detaching the second photoresist pattern from the substrate.

According to an embodiment of the disclosure, the processing the first photoresist pattern may include performing an atmospheric plasma processing.

According to an embodiment of the disclosure, the processing the first photoresist pattern may include exposing an excimer ultraviolet light to the first photoresist pattern.

According to an embodiment of the disclosure, the processing the first photoresist pattern may include impregnating the first photoresist pattern in ozone water.

According to an embodiment of the disclosure, a molecular weight of the second photoresist pattern may be less than a molecular weight of the first photoresist pattern.

According to an embodiment of the disclosure, the etching the thin film may include using one of a wet etching and a dry etching.

According to an embodiment of the disclosure, a method of stripping a stripping target object on a substrate includes processing a stripping target object on the substrate in a way such that a packing density of the stripping target object is lowered, and stripping the stripping target object from the substrate by spraying steam onto the processed stripping target object.

According to an embodiment of the disclosure, the processing the stripping target object on the substrate may include forming microcavities in the stripping target object.

According to an embodiment of the disclosure, the stripping the stripping target object from the substrate may include making moisture particles penetrate into the microcavities in the processed stripping target object, swelling the processed stripping target object by using the moisture particles, and stripping the processed stripping target object from the substrate by making a gap therebetween or by detaching the stripping target object from the substrate.

According to an embodiment of the disclosure, the processing the stripping target object on the substrate may include performing an atmospheric plasma processing.

According to an embodiment of the disclosure, the processing the stripping target object on the substrate may include exposing an excimer ultraviolet light to the stripping target object.

According to an embodiment of the disclosure, the processing the stripping target object on the substrate may include impregnating the stripping target object in ozone water.

According to an embodiment of the disclosure, the stripping target object may be a photoresist pattern.

According to another embodiment of the disclosure, a stripping device for stripping a photoresist pattern on a substrate from the substrate includes a transport unit which transports a substrate to be processed, a density decreasing unit which decreases a density of the photoresist pattern, a steam spraying unit which spray steam onto the photoresist pattern having a decreased density to strip the photoresist pattern from the substrate, and a cleaning unit which cleans the substrate.

According to an embodiment of the disclosure, the density decreasing unit may include an atmospheric plasma device.

According to an embodiment of the disclosure, the density decreasing unit may include an excimer ultraviolet light exposure device.

According to an embodiment of the disclosure, the density decreasing unit may include ozone water in which the substrate is to be impregnated.

According to an embodiment of the disclosure, the steam spraying unit may include a process chamber which processes the substrate, a steam generator which sprays steam onto the substrate, and a filter unit which filters the photoresist pattern which is stripped by the steam.

The disclosure provides a method of effectively forming a thin film pattern when electronic elements are formed. The disclosure also provides a method of effectively stripping a photoresist when a thin film pattern is formed. The disclosure also provides a stripping device which effectively strips a photoresist.

BRIEF DESCRIPTION OF THE DRAWINGS

The above and other features of the invention will become more apparent by describing in further detail exemplary embodiments thereof with reference to the accompanying drawings, in which:

FIG. 1 is a flowchart illustrating a method of forming a thin film pattern according to an embodiment of the disclosure;

DETAILED DESCRIPTION

Figure 2A:
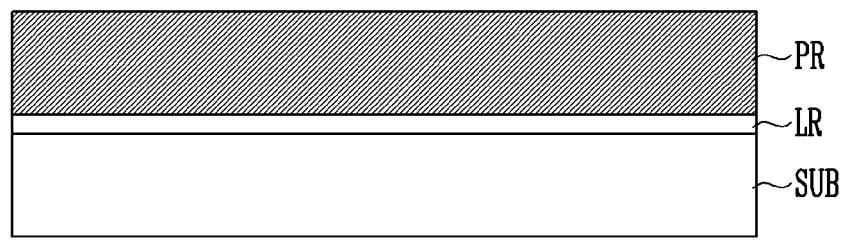
FIGS. 2A to 2I are sectional views illustrating the method of forming the thin film pattern of FIG. 1.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, exemplary embodiments of the disclosure will be described in detail with reference to the accompanying drawings.

The disclosure relates to a method of forming a thin film pattern for fabricating various types of electronic devices, and relates to a method of forming patterns of various types of configuration elements which are used for, for example, a semiconductor device and a display device.

FIG. 1 is a flowchart illustrating a method of forming a thin film pattern according to an embodiment of the disclosure.

FIGS. 2A to 2I are sectional views illustrating the method of forming the thin film pattern of FIG. 1.

Referring to FIG. 1, in an embodiment of a method of forming a thin film pattern, the thin film pattern is formed by providing a thin film on a substrate (S10), providing a photoresist on the thin film (S20), forming a first photoresist pattern by exposing and developing the photoresist (S30), etching the thin film by using the first photoresist pattern as a mask (S40), forming a second photoresist pattern by processing the first photoresist pattern (S50), and stripping the second photoresist pattern by using steam (S60).

Such an embodiment of the method of forming the thin film pattern according to the disclosure will hereinafter be described in greater detail with reference to FIGS. 1 and 2A to 2I.

Referring to FIG. 2A, in such an embodiment, a thin film LR and a photoresist PR are sequentially provided or formed on a substrate SUB.

The substrate SUB is configured or designed to provide, e.g., form or dispose, a thin film pattern thereon, and is not particularly limited. The substrate SUB may include or be formed of an insulating material or a conductive material. In an embodiment, the substrate SUB may include a wafer which is used for semiconductor elements, a metal plate, a glass substrate SUB, a polymer resin substrate SUB, or the like.

The thin film LR may include or be formed of at least one of various materials depending on the type of a pattern to be formed. In one embodiment, for example, the thin film LR may include at least one of a metal, an oxide of a metal, an organic insulating material, an inorganic insulating material, an organic conductive material, and an inorganic conductive material.

In such an embodiment, the thin film LR may be formed on the substrate SUB by various methods. In one embodiment, for example, the thin film LR may be formed on the substrate SUB by a method, such as chemical vapor deposition, physical vapor deposition, coating, or printing.

The photoresist PR is provided or formed on the entire surface of the thin film LR provided on the substrate SUB. The photoresist PR includes a photosensitive material, and may be a material in which a chemical and/or physical change occurs based on an exposure.

Figure 2B:
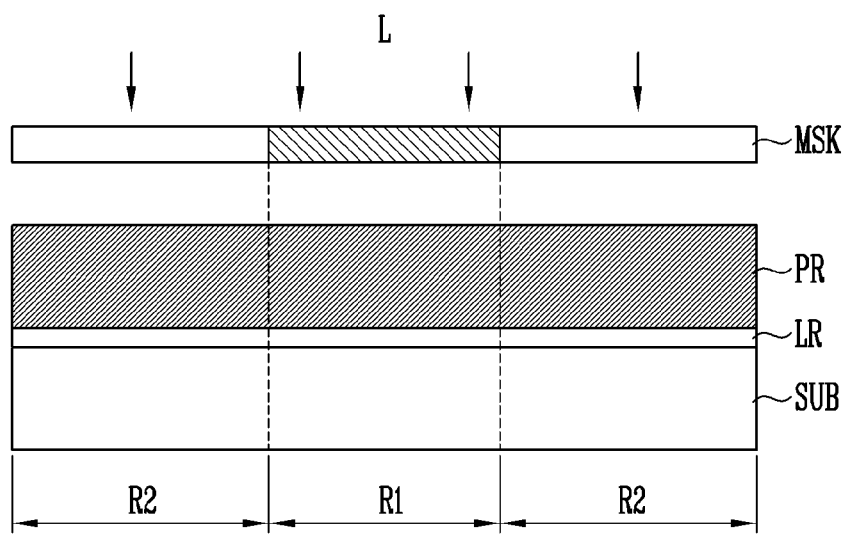

Referring to FIG. 2B, light L is exposed or applied to the photoresist PR through a mask MSK.

The mask MSK includes a first region R1 which blocks the light incident thereto and a second region R2 which allows the applied light to pass therethrough. Here, an upper surface of the substrate SUB is located below the first region R1 and the second region R2, and is divided into regions corresponding to the first and second regions R1 and R2. Hereinafter, each corresponding region of the substrate SUB is referred to as the first region R1 or the second region R2.

Figure 2C:
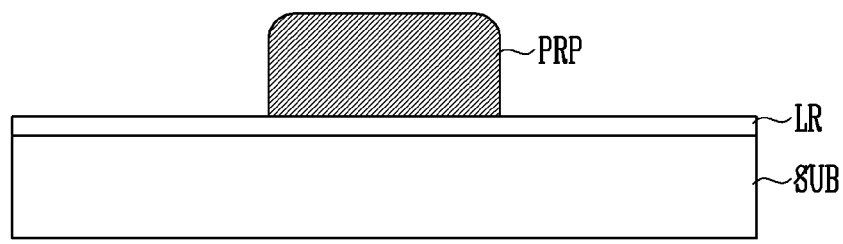

When the exposed photoresist PR is developed, a first photoresist pattern PRP with a predetermined thickness is formed in the first region R1 where the light is blocked, and the photoresist PR is removed or stripped in the second region R2 where the light passes through, and thereby, an upper surface of the substrate SUB is exposed, as illustrated FIG. 2C.

In an embodiment, as described above, positive type photoresist, in which the exposed photoresist is stripped, may be used, but the disclosure is not limited thereto. Alternatively, a negative type photoresist, in which unexposed photoresist is stripped, may be used.

Figure 2D:
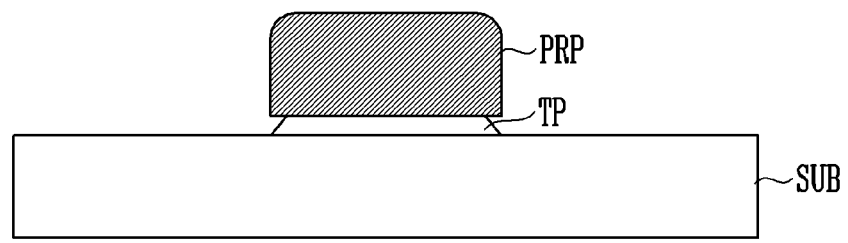

Referring to FIG. 2D, the thin film LR in the lower portion of the first photoresist pattern PRP is selectively patterned or removed by using the first photoresist pattern PRP as a mask. As a result, a thin film pattern TP is formed. The thin film LR may be selectively removed by wet etching or dry etching.

Figure 2E:
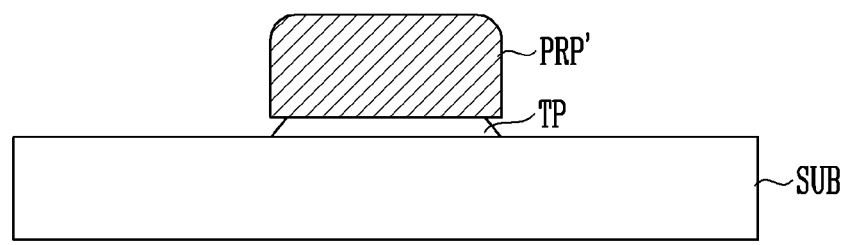

Referring to FIG. 2E, a processing of decreasing packing density of the first photoresist pattern PRP is performed, such that a second photoresist pattern PRP' having a packing density lower than a packing density of the first photoresist pattern PRP is formed. In an embodiment, where the first photoresist pattern PRP has a first packing density, the second photoresist pattern PRP' has a second packing density, which is lower than the first packing density, after the processing is performed.

The aforementioned processing corresponds to a pre-stage for easily performing stripping of a photoresist using steam thereafter. In such an embodiment, the photoresist includes an organic polymer network, such that microcavities may be formed within the photoresist pattern PRP by cutting a main chain and/or cutting a side chain, removing the side chain, changing (for example, carbonizing) a chemical functional group or the like, through the aforementioned process. As a result, the packing density may decrease.

In an embodiment of the disclosure, polymer which forms the first photoresist pattern PRP through the aforementioned process may be decomposed into relatively small molecules, and as a result, the molecular weight of the second photoresist pattern PRP' may become less than the molecular weight of the first photoresist pattern PRP. Here, the molecular weight of the first photoresist pattern PRP and the second photoresist pattern PRP' are not limited to particular molecular weights, but may be values relative to each other. In such an embodiment, the molecular weight of the second photoresist pattern PRP' is less than the molecular weight of the first photoresist pattern PRP, and may have a predetermined molecular weight determined to be effectively stripped in a steam spraying process which will be described. In one embodiment, for example, the molecular weight of the first photoresist pattern PRP may be in a range of approximately 10,000 to approximately 20,000, and the molecular weight of the second photoresist pattern PRP' may be in a range of approximately 1,000 to approximately 10,000 which are less than the molecular weight of the first photoresist pattern PRP.

In an embodiment of the disclosure, plasma processing may be performed for the first photoresist pattern PRP to form the second photoresist pattern PRP' having a lower packing density than the first photoresist pattern PRP. The plasma processing may be performed in a way or under process conditions determined based on the type of the first photoresist pattern PRP. In an embodiment of the disclosure, atmospheric plasma processing may be performed for the first photoresist pattern PRP.

When the atmospheric plasma processing is performed for the first photoresist pattern PRP, nitrogen (N2) and compressed dry air ("CDA") may be used as gas for the atmospheric plasma processing. In an embodiment of the disclosure, a flow rate of nitrogen may in a range be approximately 15 liter per minute (LPM) to approximately 30 LPM, and a flow rate of CDA may be in a range of approximately 0.1% to approximately 0.3% of the flow rate of nitrogen. In an embodiment, where atmospheric plasma processing is performed, an available voltage range of a plasma device may be in a range of approximately 7 kilovolt (kV) to approximately 14 kV. However, processing conditions of the atmospheric plasma are not limited thereto, but may be differently set to allow the packing density of the first photoresist pattern PRP to be decreased as desired.

When the plasma processing is performed for the first photoresist pattern PRP, cross-linking of the polymer is broken and thereby the polymer becomes small molecules. In one embodiment, for example, when the atmospheric plasma processing is performed for a photoresist pattern having the average molecular weight of approximately 14,000, the average molecular weight of the processed photoresist pattern is reduced to approximately 5,000.

In an alternative embodiment of the disclosure, exposure processing of the first photoresist pattern PRP may be performed to form the second photoresist pattern PRP' with a lower packing density than the first photoresist pattern PRP. In one embodiment, for example, exposure processing of the first photoresist pattern PRP may be performed by using excimer ultraviolet ("UV").

When excimer UV processing is performed for the first photoresist pattern PRP, a wavelength of UV light may be in a range of approximately 172 nanometers (nm), an illumination intensity range of a UV lamp may be in a range of approximately 100 milliwatts per square centimeter (mW/cm$^2$) to 200 mW/cm$^2$, and exposure time may be in a range of approximately 5 seconds (s) to approximately 50 s. However, processing conditions of the excimer UV are not limited thereto, but may be differently set to allow the packing density of the first photoresist pattern PRP to be decreased as desired.

When processing of the excimer UV is performed for the first photoresist pattern PRP, reaction, such as cleavage of bond, occurs in a functional group of the first photoresist pattern PRP, and as a result, polymer may become small molecules.

In an alternative embodiment of the disclosure, the first photoresist pattern PRP may be impregnated in ozone water to form the second photoresist pattern PRP' with a lower packing density than the first photoresist pattern PRP.

When the first photoresist pattern PRP is impregnated in the ozone water, a flow rate of the ozone water may be in a range of approximately 5 LPM to approximately 35 LPM, and concentration of ozone in the ozone water may be in a range of approximately 4 ppm to approximately 82 ppm.

In such an embodiment, since the ozone in the ozone water has high reactivity, the ozone may react with a crosslinking functional group of the first photoresist pattern PRP to cause an oxidation reaction. The cross-linking of the first photoresist pattern PRP is cut by the reaction and thereafter, the crosslinking functional group may be converted into hydrophilic functional group. In one embodiment, for example, where the first photoresist pattern PRP includes a crosslinking epoxy functional group, the epoxy functional group may be converted into a carboxyl functional group after the ozone processing is performed. While a cross-linked part of the epoxy functional group is cut, the first photoresist pattern PRP become small molecules thereby becoming the second photoresist pattern PRP'. In such an embodiment, the carboxyl functional group corresponds to a hydrophilic group, such that steam may be allowed to easily penetrate into the second photoresist pattern PRP'.

In an embodiment of the disclosure, the atmospheric plasma processing, the excimer UV processing or the ozone water processing may be performed selectively, but the disclosure is not limited thereto. In an embodiment, two types or more of such processing may be combined to perform complex processing.

In such an embodiment, the second photoresist pattern PRP' is stripped from the substrate SUB and the thin film pattern TP. Hereinafter, process of stripping the second photoresist pattern PRP' will be sequentially described.

Figure 2F:
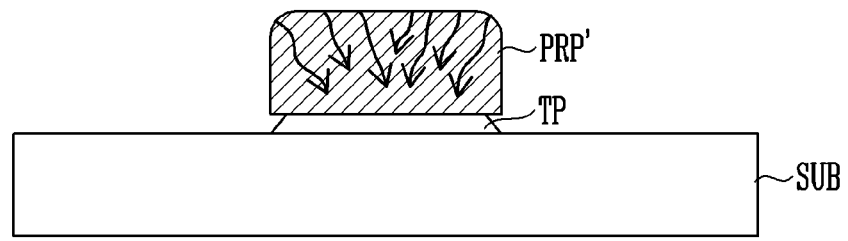

Referring to FIG. 2F, steam is sprayed onto the second photoresist pattern PRP', and the sprayed steam penetrates into the second photoresist pattern PRP'. The steam is sprayed in a state where high temperature steam and deionized water, that is, gas and liquid of water, are simultaneously mixed, and are sprayed onto the substrate SUB in a form of steam jet through a nozzle. The steam includes moisture particles having a diameter in a range of approximately several nanometers to approximately tens of micrometers, and the moisture particles penetrate into the second photoresist pattern PRP' through a portion, which is physically vulnerable, of a surface of the second photoresist pattern PRP'. As time elapses, a distance through which the moisture particles penetrate into the inside is lengthened, and as a result, the moisture particles reach the entire region of the second photoresist pattern PRP', for example, a boundary between the substrate SUB and the second photoresist pattern PRP'.

Figure 2G:
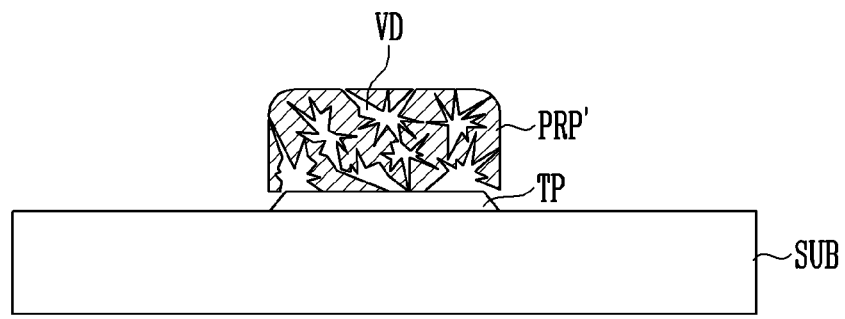

Referring to FIG. 2G, the moisture particles diffuse within the second photoresist pattern PRP', and accordingly, the second photoresist pattern PRP' swells and thereby a plurality of microcavities VD is formed inside of the second photoresist pattern PRP'.

The moisture particles are injected at a high temperature and a high pressure, and accordingly, the moisture particles have high kinetic energy. The kinetic energy may be transferred to particles in the second photoresist pattern PRP' to cut cross-linking of the second photoresist pattern PRP'. In addition, a gap may occur between second photoresist and the substrate SUB by separating a portion where adhesive force between the substrate SUB and the second photoresist pattern PRP' is weak. In such an embodiment, heat exchange and a phase change may occur in the second photoresist pattern PRP', and a shock wave may occur due to generation of bubbles by the moisture particles. Accordingly, the microcavities may be formed in the second photoresist pattern PRP'.

Figure 2H:
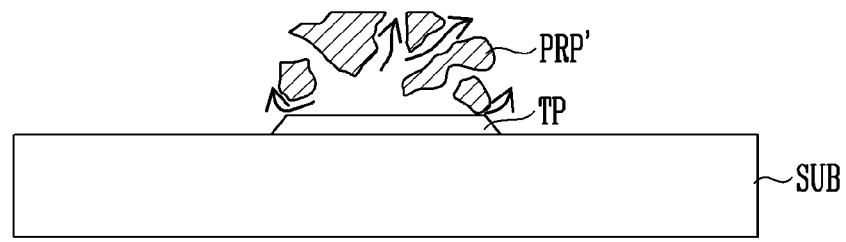

Referring to FIG. 2H, a size of the microcavity may be increased by continual swell and gap-occurrence. As a result, gap-occurrence and detachment occur in the portion where the adhesive force between the second photoresist pattern PRP' and the substrate SUB is weak, such that the second photoresist pattern PRP' is stripped.

Figure 2I:
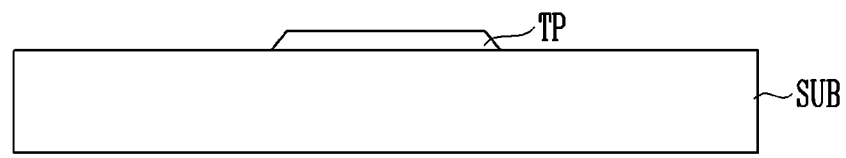

Accordingly, the thin film pattern TP is finally formed in the first region R1, as illustrated in FIG. 2I.

In such an embodiment, while the second photoresist pattern PRP' is stripped and/or after the second photoresist pattern PRP' is stripped, etch residue of the thin film pattern TP, residue of the second photoresist pattern PRP', sticky organics, and the like, which remain on the substrate SUB, are additionally removed, when steam is sprayed onto the substrate SUB.

In an embodiment, as described above, since the first photoresist pattern PRP is changed to the second photoresist pattern PRP' having a lower packing density, the first photoresist pattern PRP is easily removed by steam.

Generally, a photoresist is a substance which is used at the time of forming thin film patterns of various types of electronic elements, and a polymer organic material having the large molecular weight. Since a photoresist typically has a high packing density, moisture particles may not effectively penetrates into the photoresist. A polymer network with strong cross-linking and the large molecular weight is formed in the photoresist. Accordingly, the photoresist may not be effectively stripped without using a specified chemical stripping solution or specified chemical gas that dissolves the photoresist pattern. Generally, strong acid or a specified chemical solvent such as N-methylpyrrolidone, glycol ethers, amines or dimethylsulfoxide is used, when wet etching is performed for a photoresist having a high packing density. In addition, a strong chemical gas with high reactivity, such as gas mixture, for example, fluorine, sulfuric acid, hydrogen peroxide or the like may be used, when dry etching is performed for a photoresist having a high packing density.

In a conventional stripping method which uses the specified chemical solvent or the specified chemical gas, a separate process device for supplying and processing a raw material may be used, but it may be difficult to reprocess and cause environmental pollution. In addition, such a conventional stripping method may cause failure of an electronic element due to etch residue, photoresist residue, sticky organics or the like.

However, according to an embodiment of the disclosure, since the stripping is performed after being converted into a photoresist having a lower packing density, fine moisture particles is allowed to easily penetrate into the photoresist. Subsequently, the stripping is performed by swell and attachment/detachment of the fine moisture particles without using specific chemical stripping solution. Accordingly, in such an embodiment, problems which may be caused by the specific chemical solvent or the specific chemical gas, such as cost increase, reprocessing difficulty, or environmental pollution, may be effectively prevented from occurring. In such an embodiment, by removing the etch residue, the photoresist residue, the sticky organics and the like using fine moisture particles, the electronic element may be prevented from failing, and process cost may be substantially reduced.

In such an embodiment, a method of forming a thin film using photolithography and a method of stripping a photoresist at the time of forming a thin film pattern are described, but embodiments of the disclosure is not limited thereto.

Such an embodiment of a method of stripping photoresist using steam after converting the photoresist with a high packing density into photoresist with a low packing density may be applied to various organic polymer materials.

Such an embodiment of the method of stripping photoresist from a substrate may be applied to a substrate to be processed in which a stripping target object is formed. In such an embodiment, the substrate to be processed means a substrate having the stripping target object on an upper surface thereof. In such an embodiment, a general substrate or a specified substrate, in which other configuration elements are formed, may be provided on the lower portion of the stripping target object to be stripped, as the substrate. In such an embodiment, the stripping target object may be stripped from the substrate by applying steam to the substrate to be processed, after increasing possibility of penetration of moisture particles through a process of decreasing a packing density of the stripping target object.

Figure 3:
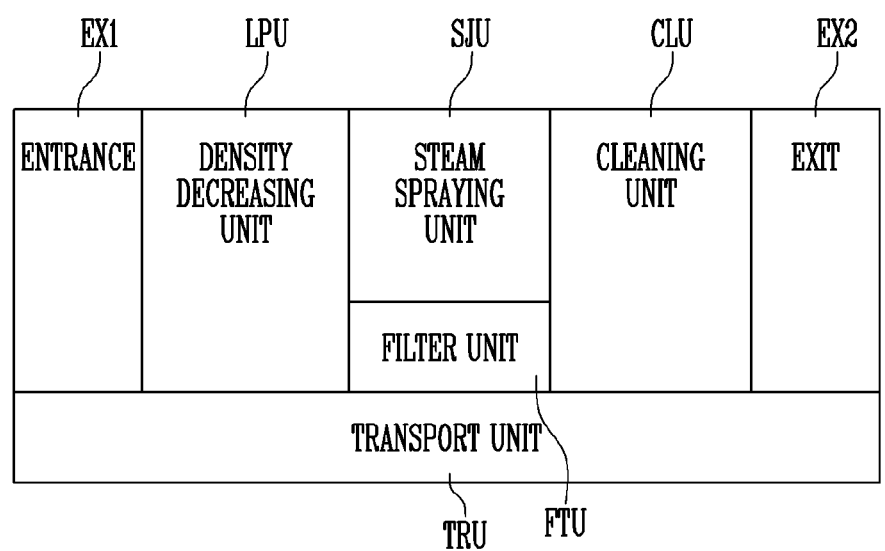
FIG. 3 illustrates a device for stripping photoresist on a substrate.

FIG. 3 illustrates a device which performs the method of forming the thin film pattern according to the embodiment of the disclosure. Particularly, FIG. 3 illustrates an embodiment of a stripping device or the device which strips a photoresist on a substrate.

Referring to FIG. 3, an embodiment of the stripping device may include a transport unit TRU, a density decreasing unit LPU, a steam spraying unit SJU, and a cleaning unit CLU.

The transport unit TRU transports a substrate to be processed into or out of chambers of each unit in which a process is performed.

The density decreasing unit LPU, the steam spraying unit SJU and the cleaning unit CLU may respectively have process chambers in which corresponding processes are performed, and may be sequentially arranged.

The density decreasing unit LPU converts a photoresist with a high packing density into the photoresist with a low packing density.

In an embodiment of the disclosure, the density decreasing unit LPU may be an atmospheric plasma device.

In an alternative embodiment of the disclosure, the density decreasing unit LPU may be an excimer UV exposure device.

In another alternative embodiment of the disclosure, the density decreasing unit LPU may include ozone water in which the substrate and the photoresist on the substrate can be impregnated.

The steam spraying unit SJU sprays steam onto a photoresist pattern with a low packing density. The photoresist pattern is stripped from a substrate to be processed by the sprayed steam.

In an embodiment of the disclosure, the steam spraying unit SJU may include a process chamber, in which the substrate to be processed is processed, and a steam generator, which sprays steam onto the substrate.

In an embodiment of the disclosure, the steam spraying unit SJU may include a filter unit FTU which filters the photoresist stripped by the steam.

The cleaning unit CLU cleans the substrate. The cleaning unit CLU removes residue of the photoresist pattern on the substrate, and removes foreign substances or impurities generated by various contaminants, such as foreign substances generated during the process, contamination from equipment, or contamination due to reactants or products during the process.

In an embodiment of the disclosure, the cleaning unit CLU may include a rinse unit (not shown) and an air knife unit (not shown for cleaning the substrate to be processed with water or other cleaning liquid.

In an embodiment of the disclosure, the steam spraying unit SJU and the cleaning unit CLU may be respectively provided in separate process chambers. Alternatively, the steam spraying unit SJU and the cleaning unit CLU may be provided in a single process chamber. Accordingly, after steam spraying onto the substrate to be processed is completed by the steam spraying unit SJU, the cleaning unit CLU cleans the substrate to be processed to briefly process stripping of the photoresist pattern and residue/foreign substances, and the like.

An embodiment of a method of stripping the photoresist from the substrate to be processed using the stripping device will hereinafter be described in detail.

In such an embodiment, a density decreasing process is performed after the substrate to be processed is moved to the density decreasing unit LPU through an entrance EX1. Subsequently, the substrate to be processed, for which the density decreasing process is performed, is transported to the steam spraying unit SJU, and a photoresist pattern is stripped by steam. The substrate to be processed, of which the photoresist pattern has been stripped, is transported to the cleaning unit CLU to be cleaned, and is transported out through an exit EX2. The transport unit TRU may transport the substrate to be processed from the entrance EX1 to the exit EX2 sequentially through the density decreasing unit LPU, the steam spraying unit SJU and the cleaning unit CLU.

In such an embodiment, the stripping device operates with high cleaning efficiency and reduced cost, compared with a conventional cleaning process, without using separate chemical stripping solution for stripping the photoresist pattern.

According to an embodiment of the disclosure, a display device may be fabricated by the aforementioned method of forming a thin film pattern. Hereinafter, an embodiment of the display device and an embodiment of a method of fabricating the display device will hereinafter be described in detail.

Figure 4A:
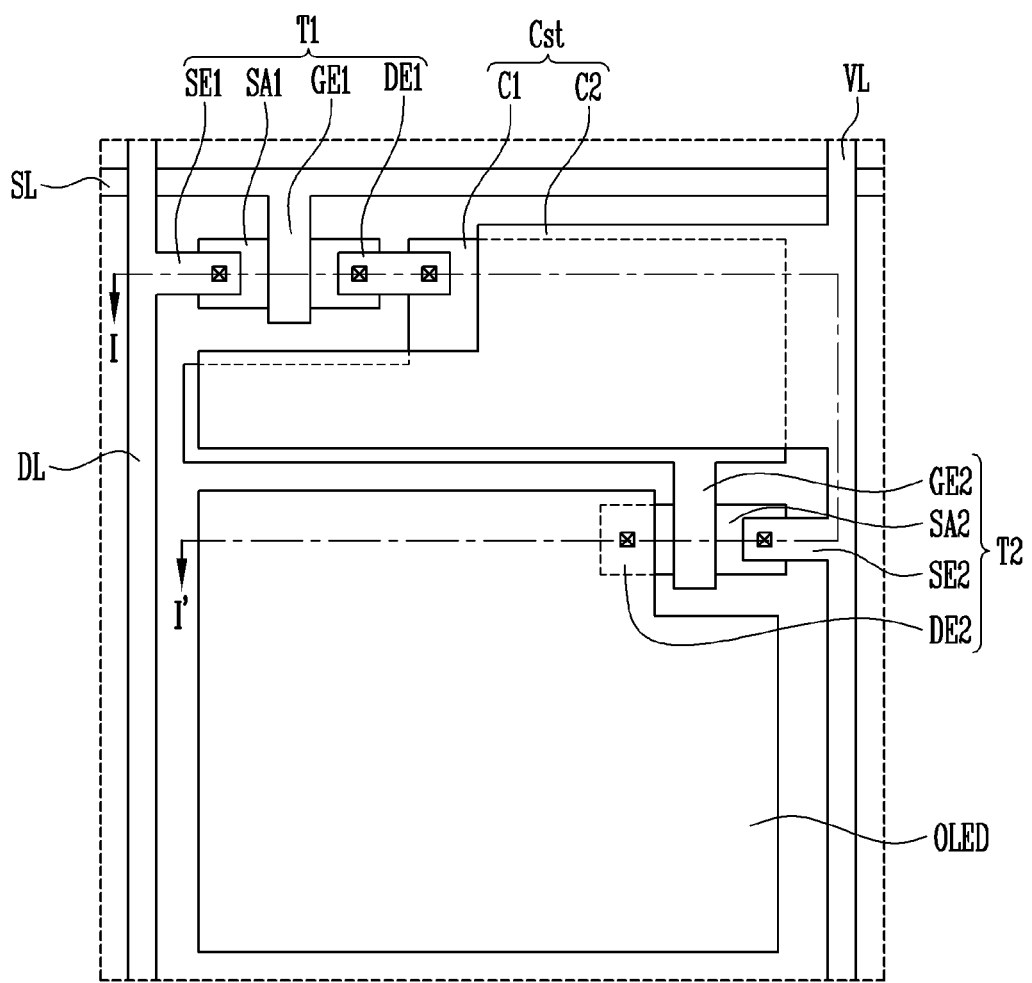
FIG. 4A is a plan view illustrating a pixel of a display device according to an embodiment of the disclosure.
Figure 4B:
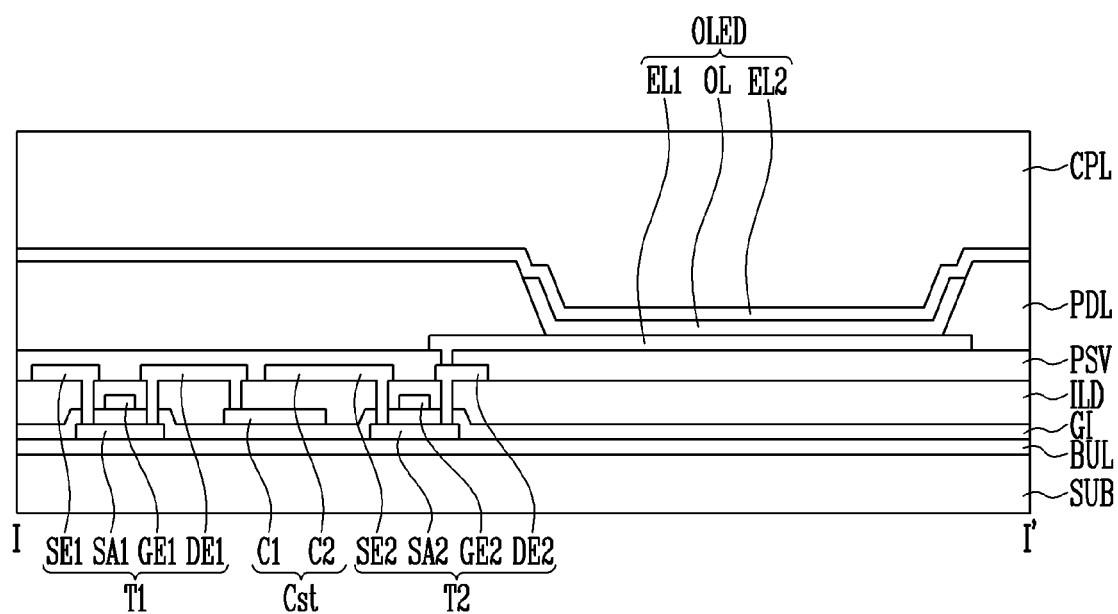
FIG. 4B is a cross-sectional view taken along line I-I' of FIG. 4A.

FIG. 4A is a plan view illustrating a pixel of the display device according to an embodiment of the disclosure. FIG. 4B is a cross-sectional view taken along line I-I' of FIG. 4A.

Referring to FIGS. 4A and 4B, an embodiment of the display device includes the substrate SUB, pixels disposed on the substrate, and a sealing film CPL disposed on the pixels.

Each of the pixels displays an image. A plurality of the pixels is disposed on the substrate, and may be arranged in a matrix form. In an embodiment, as shown in FIG. 4A, each of the pixels may have a rectangular shape, but not being limited thereto. Alternatively, each of the pixels may be modified to have one of various shapes. In one embodiment, for example, the pixels have different colors from each other, and the pixels having different colors may have different areas or different shapes from each other.

Each pixel includes a wiring portion, a thin film transistor connected to the wiring portion, an organic light emitting element OLED connected to the thin film transistor, and a capacitor Cst.

The wiring portion provides signals to each pixel, and includes scan lines SL, data lines DL and drive voltage lines VL.

The scan lines SL extend in one direction or a first direction. The data lines DL extend in another direction or a second direction intersecting the scan lines SL. The drive voltage lines VL may extend in substantially the same direction as one of the scan line SL and the data line DL, for example, the data line DL. The scan line SL transmits the scan signal to the thin film transistor, the data line DL transmits a data signal to thin film transistor, and the drive voltage line VL provides a drive voltage to the thin film transistor.

In such an embodiment, a plurality of the scan lines SL, a plurality of the data lines DL, and a plurality of the drive voltage lines VL are provided in the display device.

In an embodiment, as described above, the pixel includes the thin film transistor connected to the wiring portion, the organic light emitting element OLED connected to the thin film transistor, and the capacitor Cst.

The thin film transistor may include a drive thin film transistor T2 for controlling the organic light emitting element OLED, and a switching thin film transistor T1 for switching the drive thin film transistor T2. In an embodiment of the disclosure, each pixel includes two thin film transistors T1 and T2 and a single capacitor Cst, but the disclosure is not limited thereto. In an alternative embodiment of the disclosure, one pixel may include a single thin film transistor, or three or more thin film transistors, for example, six thin film transistors, and the number of capacitors may also change.

The switching thin film transistor T1 includes a first gate electrode GE1, a first source electrode SE1 and a first drain electrode DE1. The first gate electrode GE1 is connected to the scan line SL, and the first source electrode SE1 is connected to the data line DL. The first drain electrode DE1 is connected to a gate electrode of the drive thin film transistor T2 (that is, a second gate electrode GE2). The switching thin film transistor T1 transmits the data signal which is applied to the data line DL to the drive thin film transistor T2 in response to the scan signal which is applied to the scan line SL.

The drive thin film transistor T2 includes a second gate electrode GE2, a second source electrode SE2, and a second drain electrode DE2. The second gate electrode GE2 is connected to the switching thin film transistor T1, the second source electrode SE2 is connected to the drive voltage line VL, and the second drain electrode DE2 is connected to the organic light emitting element OLED.

The organic light emitting element OLED includes an organic light emitting layer OL, a first electrode EL1 and a second electrode EL2 disposed opposite to the first electrode EL1, thereby interposing the organic light emitting layer OL therebetween.

The organic light emitting layer OL may have a multilayer thin film structure including at least one emitting layer. In one embodiment, for example, the organic light emitting layer OL may further include at least one layer of a hole injection layer which injects holes, a hole transport layer which has high hole transportability and increases a chance of recombining a hole with an electron by suppressing movement of electrons that are not combined in the light emitting layer, the light emitting layer which emits light as the injected electrons and holes recombine with each other, an electron transport layer which smoothly transports the electrons to the light emitting layer, and an electron injection layer which injects the electrons.

In an embodiment, the organic light emitting layer OL may further include an electron blocking layer and a hole blocking layer. In such an embodiment, the hole blocking layer may be disposed between the light emitting layer and the electron transport layer, and the electron blocking layer may be disposed between the light emitting layer and the hole transport layer. In such an embodiment, the organic light emitting layer OL may have a stacking structure in which the hole injection layer, the hole transport layer, the electron blocking layer, the light emitting layer, the hole blocking layer, the electron transport layer, and the electron injection layer are sequentially stacked one on another.

In an embodiment, the hole injection layer, the hole transport layer, the hole blocking layer, the electron transport layer, the electron injection layer and the electron blocking layer may be defined in accordance with a general separation method, and each layer may perform another function not indicated by a name thereof. In one embodiment, for example, the hole transport layer may perform a function of the electron blocking layer which prevents the electrons generated by the light emitting layer from diffusing depending on the type of selected compound in addition to a role of transporting the holes. In an embodiment, the electron transport layer may perform a function of the hole blocking layer which prevents the holes generated by the light emitting layer from diffusing depending on the type of selected compound in addition to a function of transporting the electrons.

In an embodiment, color of the light which is emitted from the light emitting layer may be one of red, green, blue and white, but the disclosure is not limited to this. In one alternative embodiment, for example, color of the light which is emitted from the light emitting layer of the organic light emitting layer OL may be one of magenta, cyan, and yellow.

In an embodiment, the first electrode EL1 is connected to the second drain electrode DE2 of the drive thin film transistor T2. A common voltage may be applied to the second electrode EL2.

The organic light emitting layer OL controls light emission, that is, emits or does not emit light, in response to an output signal of the drive thin film transistor T2, to display an image. In such an embodiment, the frequency or color of the light emitted from the organic light emitting layer OL may be determined based on a material of the light emitting layer. In an embodiment, the light emitted from the organic light emitting layer OL may be color light or white light.

The capacitor Cst is connected between the second gate electrode GE2 and the second source electrode SE2 of the drive thin film transistor T2. The capacitor Cst is charged with the data signal which is input to the second gate electrode GE2 of the drive thin film transistor T2, and maintains the data signal.

In an embodiment, each of the drive thin film transistor T2 and the switching thin film transistor T1 may have a top gate structure is described, but the disclosure is not limited thereto. In one alternative embodiment, for example, at least one of the drive thin film transistor T2 and the switching thin film transistor T1 may have a bottom gate structure.

Hereinafter, an embodiment of a method of fabricating the display device a will be described in accordance with a stacking order.

In an embodiment, the display device includes the substrate SUB on which the thin film transistor and the organic light emitting element OLED are stacked.

The substrate SUB is formed of an insulating material. In an embodiment, the substrate SUB may be a rigid substrate. In one embodiment, for example, the substrate SUB may be one of a glass base substrate, a quartz base substrate, a glass ceramic base substrate, and a crystalline glass base substrate.

In an alternative embodiment, the substrate SUB may be a flexible substrate. In such an embodiment, the substrate SUB may be one of a film base substrate and a plastic base substrate which include a polymer organic material. In one embodiment, for example, the substrate SUB may include at least one of polyethersulfone ("PES"), polyacrylate, polyetherimide ("PEI"), polyethylene naphthalate ("PEN"), polyethylene terephthalate ("PET"), polyphenylene sulfide ("PPS"), polyarylate ("PAR"), polyimide ("PI"), polycarbonate ("PC"), tri acetate cellulose ("TAC"), and cellulose acetate propionate ("CAP"). In such an embodiment, the substrate SUB may include a fiber glass reinforced plastic ("FRP").

A buffer layer BUL is provided or formed on the substrate SUB. The buffer layer BUL effectively prevents impurities from diffusing into the switching and drive thin film transistors T1 and T2. The buffer layer BUL may be formed of a material such as silicon nitride (SiNx), silicon oxide (SiOx), silicon oxynitride (SiOxNy) by a deposition method. Alternatively, the buffer layer BUL may be omitted depending on a material and process conditions of the substrate SUB.

A first semiconductor pattern SA1 and a second semiconductor pattern SA2 are provided or formed on the buffer layer BUL through a first photolithography process.

The first semiconductor pattern SA1 and the second semiconductor pattern SA2 may be formed by sequentially forming a semiconductor film and a photoresist, exposing and developing the photoresist, etching the semiconductor film by using the photoresist as a mask, converting the photoresist into a photoresist with a lower packing density, and stripping the photoresist with the low packing density from the patterned semiconductor film by using steam.

Each of the first semiconductor pattern SA1 and the second semiconductor pattern SA2 includes a source region, a drain region, and a channel region provided between the source region and the drain region. The first semiconductor pattern SA1 and the second semiconductor pattern SA2 may be formed of silicon which is doped or not doped, for example, polysilicon, or amorphous silicon, or may be formed of an oxide semiconductor or the like.

A gate insulating film GI is provided on the first semiconductor pattern SA1 and the second semiconductor pattern SA2. The gate insulating film GI may be formed of an organic or inorganic insulating material. In one embodiment, for example, the gate insulating film GI may include at least one of silicon oxide (SiOx) and silicon nitride (SiNx). The gate insulating film GI may be formed of the materials by a deposition method.

The scan line SL, and the first gate electrode GE1 and the second gate electrode GE2 which are connected to the scan line SL, are formed on the gate insulating film GI through a second photolithography process.

The scan line SL, the first gate electrode GE1 and the second gate electrode GE2 may be formed by sequentially forming a conductive film and a photoresist, exposing and developing the photoresist, etching the conductive film by using the photoresist as a mask, converting the photoresist into a photoresist with a low packing density, and stripping the photoresist with the low packing density from the patterned conductive film by using steam.

The conductive film may include a conductive material. In one embodiment, for example, the conductive film may include a metal, an alloy of the metals, conductive polymer, conductive metal oxide or the like. In such an embodiment, the metal may include copper, silver, gold, platinum, palladium, nickel, tin, aluminum, cobalt, rhodium, iridium, iron, ruthenium, osmium, manganese, molybdenum, tungsten, niobium, tantalum, titanium, bismuth, antimony, lead, and the like. In such an embodiment, the conductive metal oxide may include indium tin oxide ("ITO"), indium zinc oxide ("IZO"), antimony zinc oxide ("AZO"), indium tin zinc oxide ("ITZO"), zinc oxide (ZnO), tin oxide (SnO$_2$), and the like. In an embodiment of the disclosure, the conductive film may be formed of a single film or a multiple films. The conductive polymer may include at least one of a polythiophene group compound, a polypyrrole group compound, a polyaniline group compound, a polyacetylene group compound, a polyphenylene group compound and a combination thereof. In one embodiment, for example, a poly(3,4-ethylenedioxythiophene) polystyrene sulfonate ("PEDOT:PSS") compound of polythiophene group may be used as the conductive polymer.

The first gate electrode GE1 and the second gate electrode GE2 are formed to respectively cover regions corresponding to the channel regions of the first semiconductor pattern SA1 and the second semiconductor pattern SA2.

An interlayer insulating film ILD is formed on the first and second gate electrodes GE1 and GE2 to cover the first and second gate electrodes GE1 and GE2. The interlayer insulating film may be formed of an organic or inorganic insulating material by a deposition method, a coating method, a printing method or the like.

In an embodiment, the inorganic insulating material may include at least one of silicon oxide and silicon nitride. In such an embodiment, the organic insulating material may include at least one of polyacrylates resin, epoxy resin, phenolic resin, polyamides resin, polyimides resin, unsaturated polyesters resin, poly-phenylene ethers resin, poly-phenylene sulfides resin, and benzocyclobutenes resin.

Contact holes which expose a part of the first semiconductor pattern SA1 and the second semiconductor pattern SA2 are formed in the interlayer insulating film ILD through a third photolithography process.

The contact hole may be formed by forming a photoresist on the interlayer insulating film ILD, exposing and developing the photoresist, etching the interlayer insulating film ILD by using the photoresist as a mask, converting the photoresist into a photoresist with a low packing density, and stripping the photoresist with the low packing density from the interlayer insulating film ILD by using steam.

The data line DL, the first source electrode SE1, the first drain electrode DE1, the second source electrode SE2 and the second drain electrode DE2 are formed on the interlayer insulating film ILD through a fourth photolithography process.

The data line DL, the first source electrode SE1, the first drain electrode DE1, the second source electrode SE2 and the second drain electrode DE2 may be formed by forming a conductive film and a photoresist, exposing and developing the photoresist, etching the conductive film by using the photoresist as a mask, converting the photoresist into a photoresist with a low packing density, and stripping the photoresist with the low packing density from the patterned conductive film by using steam.

The conductive film may include a conductive material. In one embodiment, for example, the conductive film may include at least one of a metal, an alloy of the metals, a conductive polymer and a conductive metal. In such an embodiment, the metal may include copper, silver, gold, platinum, palladium, nickel, tin, aluminum, cobalt, rhodium, iridium, iron, ruthenium, osmium, manganese, molybdenum, tungsten, niobium, tantalum, titanium, bismuth, antimony, lead, and the like. In such an embodiment, the conductive metal oxide may include ITO, IZO, AZO, ITZO, zinc oxide (ZnO), tin oxide (SnO$_2$), and the like. In an embodiment of the disclosure, the conductive film may be formed of a single film or a multiple films. The conductive polymer may include at least one of a polythiophene group compound, a polypyrrole group compound, a polyaniline group compound, a polyacetylene group compound, a poly-phenylene group compound and a combination (or mixture) thereof. In one embodiment, for example, a PEDOT:PSS compound of polythiophene group may be used as the conductive polymer.

Accordingly, the first source electrode SE1 and the first drain electrode DE1 respectively come into contact with the source region and the drain region of the first semiconductor pattern SA1 by the contact holes formed in the gate insulating film GI and the interlayer insulating film ILD. The second source electrode SE2 and the second drain electrode DE2 respectively come into contact with the source region and the drain region of the second semiconductor pattern SA2 by the contact holes formed in the gate insulating film GI and the interlayer insulating film ILD.

In such an embodiment, a part of the second gate electrode GE2 and a part of the drive voltage line VL respectively define a first capacitor electrode C1 and a second capacitor electrode C2, and define the capacitor Cst by interposing the interlayer insulating film ILD therebetween.

A protection film PSV is provided or formed on the first source electrode SE1, the first drain electrode DE1, the second source electrode SE2 and the second drain electrode DE2.

A contact hole which exposes a part of the second drain electrode DE2 is formed in the protection film PSV through a fifth photolithography.

In an embodiment of the disclosure, the contact hole may be formed by forming a photoresist on the protection film PSV, exposing and developing the photoresist, etching the protection film PSV by using the photoresist as a mask, converting the photoresist into a photoresist with a low packing density, and stripping the photoresist with a low packing density from the protection film PSV by using steam.

In an embodiment of the disclosure, the protection film PSV may include or be formed of a photosensitive material. In such an embodiment, the protection film PSV may be formed by exposing and developing the protection film without using a separate photoresist.

The protection film PSV may perform a role of a protection film that protects the switching and drive thin film transistors T1 and T2, and may perform a role of a planarization film by having a flat or planarized upper surface.

In an embodiment, the protection film may include or be formed of an organic or inorganic insulating material by a deposition method, a coating method, a printing method or the like.

In such an embodiment, the inorganic insulating material may include at least one of silicon oxide and silicon nitride, for example. In such an embodiment, the organic insulating material may include at least one of polyacrylates resin, epoxy resin, phenolic resin, polyamides resin, polyimides resin, unsaturated polyesters resin, poly-phenylene ethers resin, poly-phenylene sulfides resin, and benzocyclobutenes resin, for example.

The first electrode EL1 is provided or formed on the protection film PSV as an anode of the organic light emitting element OLED through a fifth photolithography.

The first electrode EL1 may be formed by sequentially forming a conductive film and a photoresist, exposing and developing the photoresist, etching the conductive film by using the photoresist as a mask, converting the photoresist into a photoresist with a low packing density, and stripping the photoresist with the low packing density from the patterned conductive film by using steam.

The conductive film may be formed of a material with a high work function by a deposition method. In an embodiment, where an image is intended to be displayed in a downward direction of the substrate SUB, the conductive film may be formed of a transparent conductive film, such as ITO, IZO, zinc oxide (ZnO), and ITZO. In an alternative embodiment, where an image is intended to be displayed in an upward direction of the substrate SUB, the first electrode EL1 may be formed of a metal reflective film, such as Ag, Mg, Al, Pt, Pd, Au, Ni, Nd, Ir, Cr or the like, and the transparent conductive film, such ITO, IZO, zinc oxide (ZnO), and ITZO.

The first electrode EL1 is connected to the second drain electrode DE2 of the drive thin film transistor T2 through the contact hole formed in the protection film PSV. In an embodiment, the first electrode EL1 may be an anode or a cathode. Hereinafter, for convenience of description, an embodiment where the first electrode EL1 is an anode will be described in detail.

A pixel defining film PDL which partitions pixel regions corresponding to each pixel is formed on the substrate SUB on which the first electrode EL1 and the like are formed. The pixel defining film PDL exposes an upper surface of the first electrode EL1, and protrudes from the substrate SUB along a periphery of the pixel.

In an embodiment of the disclosure, the pixel defining film PDL may be formed by sequentially forming an insulating film and a photoresist, exposing and developing the photoresist, etching the insulating film by using the photoresist as a mask, converting the photoresist into a photoresist with a low packing density, and stripping the photoresist with the low packing density from the patterned insulating film by using steam.

In an alternative embodiment of the disclosure, the pixel defining film PDL may be formed of a photosensitive material, and may be formed by exposing and developing the pixel defining film PDL without using a separate photoresist.

The insulating film for the pixel defining film PDL may be formed of an organic or inorganic insulating material by a deposition method, a coating method, a printing method or the like. In an embodiment, where the insulating film is an organic insulating film, the insulating film may include at least one of polyacrylates resin, epoxy resin, phenolic resin, polyamides resin, polyimides resin, unsaturated polyesters resin, poly-phenylene ethers resin, poly-phenylene sulfides resin, and benzocyclobutenes resin.

The organic light emitting layer OL is provided or formed in a pixel region which is surrounded by the pixel defining film PDL. The organic light emitting layer OL may be formed by a deposition method, a coating method or the like.

The second electrode EL2 is provided or formed on the organic light emitting layer OL. The second electrode EL2 may include a material with a lower work function than the transparent conductive film of the first electrode EL1. In one embodiment, for example, the second electrode EL2 may include at least one of molybdenum (Mo), tungsten (W), silver (Ag), magnesium (Mg), aluminum (Al), platinum (Pt), palladium (Pd), gold (Au), nickel (Ni), neodymium (Nd), iridium (Ir), chromium (Cr), nickel (Li), calcium (Ca), and an alloy thereof.

The sealing film CPL which covers the second electrode EL2 is provided or formed on the second electrode EL2 by a deposition method or the like. The sealing film CPL may include a plurality of inorganic films and a plurality of organic films. In one embodiment, for example, the sealing film CPL may have a structure in which the inorganic films and the organic films are alternately stacked one on another. In such an embodiment, a top layer of the sealing film CPL may be an inorganic film. An inorganic material of the inorganic film may include at least one of silicon oxide (SiOx), silicon nitride (SiNx), silicon oxynitride (SiON), aluminum oxide (Al$_2$O$_3$), titanium oxide (TiO$_2$), zirconium oxide (ZrOx) and tin oxide (ZnO). An organic material of the organic film may include at least one of polyacrylates resin, epoxy resin, phenolic resin, polyamides resin, polyimides rein, unsaturated polyesters resin, poly-phenylene ethers resin, poly-phenylene sulfides resin, and benzocyclobutenes resin.

In an embodiment, as described above, the display device may be fabricated through multiple photolithography processes, and at least one of the multiple photolithography processes may be performed based on the method of forming a thin film pattern according to the embodiment of the disclosure. However, the method of fabricating the display device according to the embodiment of the disclosure is not limited to those described above, but the known method of forming a pattern and the method of forming a thin film pattern according to the disclosure may also be variously combined with each other. In one embodiment, for example, the wiring portion may be formed by the method of forming a thin film pattern according to the disclosure, and the gate insulating film, the interlayer insulating film, or the protection film may be formed by the known method of forming a thin film pattern.

In an embodiment, as described above, the display device may be fabricated through five photolithography processes, but other configuration elements may also be additionally patterned through photolithography. In one embodiment, for example, a patterning process of the second electrode is not described in the embodiment of the disclosure, but patterning may be desired for an unillustrated portion. In such an embodiment, the method of forming a thin film pattern according to the disclosure may be used.

A display device which is fabricated by the aforementioned methods, and other embodiments may be used for various applications. In one embodiment, for example, the display device may be used for a mobile device, a smart phone, an electronic book, a laptop computer, a notebook computer, a tablet computer, a personal computer, a billboard, and the like, and are not limited thereof.

Above description is made with reference to the preferred embodiment of the disclosure, but the skilled in the art or those having ordinary knowledge in the art will be able to understand that the disclosure may be variously modified and changed in a range without departing from the spirit and a technical area of the disclosure that are described in the scope of claims which will be described below.

Thus, the technical range of the disclosure is not limited to the description of the specification of the application, and should be determined by the scope of claims.

What is claimed is:

1. A method of forming a thin film pattern, the method comprising:
providing a thin film on a substrate:
providing a photoresist on the thin film;
forming a first photoresist pattern having a first packing density by exposing and developing the photoresist;
etching the thin film by using the first photoresist pattern as a mask;
processing the first photoresist pattern to convert the first photoresist pattern into a second photoresist pattern having a second packing density, which is lower than the first packing density, wherein a molecular weight of the second photoresist pattern is less than a molecular weight of the first photoresist pattern; and
stripping the second photoresist pattern by spraying steam onto the second photoresist pattern.

2. The method of forming the thin film pattern according to claim 1, wherein the processing the first photoresist pattern comprises forming microcavities in the first photoresist pattern.

3. The method of forming the thin film pattern according to claim 2, wherein the stripping the second photoresist pattern by spraying the steam onto the second photoresist pattern comprises:
providing moisture particles of the steam into the microcavities in the second photoresist in a way such that the second photoresist pattern is swollen by the moisture particles; and
stripping the second photoresist pattern from the substrate by making a gap therebetween or by detaching the second photoresist pattern from the substrate.

4. The method of forming the thin film pattern according to claim 2, wherein the processing the first photoresist pattern comprises performing an atmospheric plasma processing.

5. The method of forming the thin film pattern according to claim 2, wherein the processing the first photoresist pattern comprises exposing an excimer ultraviolet light to the first photoresist pattern.

6. The method of forming the thin film pattern according to claim 2, wherein the processing the first photoresist pattern comprises impregnating the first photoresist pattern in ozone water.

7. The method of forming the thin film pattern according to claim 1, wherein the etching the thin film comprises using one of a wet etching and a dry etching.

8. A method of stripping a stripping target object on a substrate, the method comprising:
   processing the stripping target object on the substrate in a way such that a packing density and a molecular weight of the stripping target object are lowered; and
   stripping the stripping target object from the substrate by spraying steam onto the processed stripping target object.

9. The method of stripping the stripping target object according to claim 8, wherein the processing the stripping target object on the substrate comprises forming microcavities in the stripping target object.

10. The method of stripping the stripping target object according to claim 9, wherein the stripping the stripping target object from the substrate comprises:
    making moisture particles penetrate into the microcavities in the processed stripping target object;
    swelling the processed stripping target object by using the moisture particles; and
    stripping the processed stripping target object from the substrate by making a gap therebetween or by detaching the stripping target object from the substrate.

11. The method of stripping the stripping target object according to claim 9, wherein the processing the stripping target object on the substrate comprises performing an atmospheric plasma processing.

12. The method of stripping the stripping target object according to claim 9, wherein the processing the stripping target object on the substrate comprises exposing an excimer ultraviolet light to the stripping target object.

13. The method of stripping the stripping target object according to claim 9, wherein the processing the stripping target object on the substrate comprises impregnating the stripping target object in ozone water.

14. The method of stripping the stripping target object according to claim 8, wherein the stripping target object is a photoresist pattern.

* * * * *